United States Patent
Wu et al.

(10) Patent No.: US 9,882,132 B2
(45) Date of Patent: Jan. 30, 2018

(54) EVAPORATION EQUIPMENT AND EVAPORATING METHOD

(71) Applicants: BOE TECHNOLOGY GROUP CO., LTD., Beijing (CN); ORDOS YUANSHENG OPTOELECTRONICS CO., LTD., Ordos (CN)

(72) Inventors: Haidong Wu, Beijing (CN); Qun Ma, Beijing (CN); Taegyu Kim, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 134 days.

(21) Appl. No.: 14/443,938

(22) PCT Filed: Oct. 27, 2014

(86) PCT No.: PCT/CN2014/089539
§ 371 (c)(1),
(2) Date: May 19, 2015

(87) PCT Pub. No.: WO2016/029539
PCT Pub. Date: Mar. 3, 2016

(65) Prior Publication Data
US 2016/0301007 A1    Oct. 13, 2016

(30) Foreign Application Priority Data

Aug. 28, 2014    (CN) .......................... 2014 1 0433251

(51) Int. Cl.
*H01L 51/00*    (2006.01)
*H01L 21/67*    (2006.01)
(Continued)

(52) U.S. Cl.
CPC .......... *H01L 51/0029* (2013.01); *C23C 14/24* (2013.01); *C23C 14/541* (2013.01);
(Continued)

(58) Field of Classification Search
CPC ........... H01L 51/0029; H01L 21/67109; H01L 51/56
See application file for complete search history.

(56) References Cited

U.S. PATENT DOCUMENTS

2004/0021611 A1* 2/2004 Lida .................. H01Q 21/0087
                                                        343/770
2004/0235406 A1* 11/2004 Duescher ............. C09K 3/1436
                                                        451/527

* cited by examiner

*Primary Examiner* — Thanh V Pham
(74) *Attorney, Agent, or Firm* — Harness, Dickey & Pierce, P.L.C.

(57) ABSTRACT

The disclosed in the present disclosure is an evaporation equipment and an evaporating method. The evaporation equipment may include: a support, which is arranged for loading a substrate to be evaporated; and a zone temperature controlling device, which includes at least two temperature controlling parts and at least one temperature controlling device. A loading surface of the support may include a plurality of zones, and each of the plurality of zones may correspond to an evaporation region of the substrate to be evaporated. And each of the plurality of zones may be arranged with a temperature controlling part, and the temperature controlling device may be configured to control temperatures provided by the temperature controlling parts, so as to control corresponding deposition rates of film coating on the evaporation regions.

9 Claims, 3 Drawing Sheets

(51) Int. Cl.
*C23C 14/24* (2006.01)
*H01L 21/66* (2006.01)
*H01L 51/56* (2006.01)
*C23C 14/54* (2006.01)
(52) U.S. Cl.
CPC .... *H01L 21/6715* (2013.01); *H01L 21/67109* (2013.01); *H01L 21/67248* (2013.01); *H01L 22/20* (2013.01); *H01L 51/56* (2013.01); *H01L 51/001* (2013.01)

EVAPORATION EQUIPMENT AND EVAPORATING METHOD

CROSS-REFERENCE TO RELATED APPLICATION APPLICATIONS

This application is the U.S. national phase of PCT Application No. PCT/CN2014/089539 filed on Oct. 27, 2014, which claims a priority of the Chinese Patent Application No. 201410433251.9 filed on Aug. 28, 2014, the disclosures of which are incorporated in their entirety by reference herein.

TECHNICAL FIELD

The present disclosure relates to the field of evaporation technology, in particular to an evaporation equipment and an evaporating method.

BACKGROUND

In the course of manufacturing Organic Light-Emitting Diode (OLED) devices, film coating by evaporation is one of the most critical steps, because display effect and lifespan of OLED devices largely depend on how well the uniformity and evenness of thickness of film coating are. As a result, the uniformity and evenness of thickness of film coating are always important factors to be controlled during the manufacturing process. However, in the case of film coating with larger area by evaporation, it is too challenging to guarantee a prefect uniformity and evenness in terms of thickness for film coating, due to limits brought by evaporation source and material themselves.

SUMMARY

An object of the present disclosure is to provide an evaporation equipment and an evaporating method, which can improve the problems in non-uniformity and unevenness of film coating formed by a conventional evaporation equipment.

Technical solutions provided by the present disclosure are as follows.

In one aspect of the present disclosure, an evaporation equipment is provided. The evaporation equipment may include: a support, which is arranged for loading a substrate to be evaporated, wherein a loading surface of the support includes a plurality of zones, and each of the plurality of zones corresponds to an evaporation region of the substrate to be evaporated; and a zone temperature controlling device, which includes at least two temperature controlling parts and at least one temperature controlling device, wherein each of the plurality of zones is arranged with a temperature controlling part, and the temperature controlling device is configured to control temperatures provided by the temperature controlling parts, so as to control corresponding deposition rates of film coating on the evaporation regions.

Alternatively, in the case that there is only one temperature controlling device, the temperature controlling device is connected with each of the temperature controlling parts; or in the case that there is a plurality of temperature controlling devices, each of the temperature controlling parts is connected with a corresponding temperature controlling device of the plurality of temperature controlling devices.

Alternatively, each of the temperature controlling parts may include a liquid accommodation chamber, which is arranged between the support and the substrate to be evaporated, or on a side of the support opposite to the substrate to be evaporated, or inside the support. And each of the temperature controlling devices may include: a heating part, which is connected with the liquid accommodation chamber and is configured to heat liquid inside the liquid accommodation chamber; a cooling part, which is connected with the liquid accommodation chamber and is configured to cool the liquid inside the liquid accommodation chamber; and at least one controlling part, which is connected with the heating part and the cooling part and is configured to control the heating part or the cooling part, so as to enable the liquid inside the liquid accommodation chamber to reach a predetermined temperature.

Alternatively, in the case that there is only one controlling part, the controlling part is configured to control each of the heating parts and each of the cooling parts that are connected with a plurality of liquid accommodation chambers; or in the case that there are a plurality of controlling parts, each of the heating parts and each of the cooling parts that are connected with the liquid accommodation chambers are controlled by a corresponding controlling part of the plurality of controlling parts.

Alternatively, the zone temperature controlling device may further include at least one temperature detecting device, which is connected with the temperature controlling part and the temperature controlling device, and may be configured to measure temperature provided by the temperature controlling part and provide the measured temperature to the temperature controlling device, such that the temperature controlling device controls the temperature provided by the temperature controlling part.

Alternatively, in the case that there is only one temperature detecting device, the temperature detecting device is connected with each of the temperature controlling parts; or in the case that there is a plurality of temperature detecting devices, each of the temperature controlling parts corresponds to one of the temperature detecting devices.

Alternatively, the evaporation equipment may further include: a film thickness measuring device, which is connected with the temperature controlling device(s), and is configured to measure a thickness of film coating within each of the evaporation regions of the substrate after the evaporation process and provide the measured thickness of film coating within each of the evaporation regions of the substrate to the temperature controlling device(s); wherein the temperature controlling device(s) is(are) further configured to determine whether or not the measured thickness of film coating within each of the evaporation regions of the substrate meets a predetermined thickness, and maintain the temperature provided by the temperature controlling parts for the evaporation region(s) where the measured thickness of film coating meets the predetermined thickness; and adjust the temperature provided by the temperature controlling parts for the evaporation region(s) where the measured thickness of film coating does not meet the predetermined thickness.

Alternatively, the film thickness measuring device may be an ellipsometer, or a magnetic coating thickness gauge, or an eddy current coating thickness gauge, or an X ray fluorescence coating thickness gauge.

Alternatively, the evaporation equipment may further include an evaporating chamber. And the support and the zone temperature controlling device may be both arranged inside the evaporating chamber of the evaporation equipment; and the film thickness measuring device may be arranged outside the evaporating chamber.

Alternatively, the temperature provided by the temperature controlling parts may be within a range of 5-100° C.

According to another aspect of the present disclosure, an evaporating method is provided. The method may include: an arranging step, in which a substrate to be evaporated is arranged on a support, wherein a loading surface of the support includes a plurality of zones, each of the plurality of zones corresponds to an evaporation region of the substrate to be evaporated, and the support is further arranged with a zone temperature controlling device that includes at least two temperature controlling parts, and wherein one each of the plurality of zones is arranged with a temperature controlling part; an evaporating step, in which the substrate to be evaporated is evaporated; a measuring step, in which a thickness of film coating within each of the evaporation regions of the substrate after the evaporation process is measured; and a determining step, in which whether or not the measured thickness of film coating within each of the evaporation regions of the substrate meets a predetermined thickness is determined; in the case that resultant thickness of film coating within each of the evaporation regions of the substrate meets the predetermined thickness, maintaining the temperature provided by the temperature controlling parts and evaporating a next substrate to be evaporated at the current temperature provided by the temperature controlling parts; and in the case that the resultant thickness of film coating within each of the evaporation regions of the substrate does not meet the predetermined thickness, adjusting the temperature provided by the temperature controlling parts and evaporating a next substrate to be evaporated at the adjusted temperature provided by the temperature controlling parts, Alternatively, in the evaporating step, when a first substrate is evaporated, turning on the temperature controlling parts such that the temperature controlling parts provide an initial temperature.

Alternatively, after the determining step, the method may further include a step of: in the case that on the substrate there are evaporating regions where the resultant thickness of film coating does not meet the predetermined thickness, when a next substrate is evaporated, repeating the measuring step and the determining step.

Alternatively, after the determining step, the method may further include a step of: in the case that the resultant thickness of film coating within respective evaporation regions on the substrate meets the predetermined thickness, when a next substrate is evaporated, not conducting the measuring step and the determining step any longer.

Alternatively, in the case that on the substrate there are evaporating regions where the resultant thickness of film coating does not meet the predetermined thickness, the adjusting the temperature provided by the temperature controlling parts includes: when a resultant thickness of film coating within a evaporation region of the substrate is larger than the predetermined thickness, raising up the temperature provided by the corresponding temperature controlling part; when a resultant thickness of film coating within a evaporation region of the substrate is smaller than the predetermined thickness, lowering the temperature provided by the corresponding temperature controlling part; and when a resultant thickness of film coating within a evaporation region of the substrate is equal to the predetermined thickness, unchanging the temperature provided by the corresponding temperature controlling part.

Alternatively, after the determining step, the method may further include a step of: when the resultant thicknesses of film coating within all of the evaporation regions of the substrate are smaller than the predetermined thickness, lengthening a period for evaporating a next substrate to be evaporated so as to increase the thickness of film coating.

Alternatively, the substrate to be evaporated may be a substrate of an Organic Light-Emitting Diode (OLED) device.

The present disclosure has beneficial effects as follows:

According to the evaporation equipment and the evaporating method provided by the present disclosure, at an initial stage for evaporating a batch of substrates, thicknesses of film coating of the substrates are measured first. And then temperatures provided by temperature controlling parts on different zones are adjusted according to the measured thicknesses, so as to control deposition rates of film coating on different evaporation regions of a next substrate to be evaporated, thereby the uniformity and evenness of thickness of film coating of subsequent substrates to be evaporated can be guaranteed.

DETAILED DESCRIPTION

Figure 1:
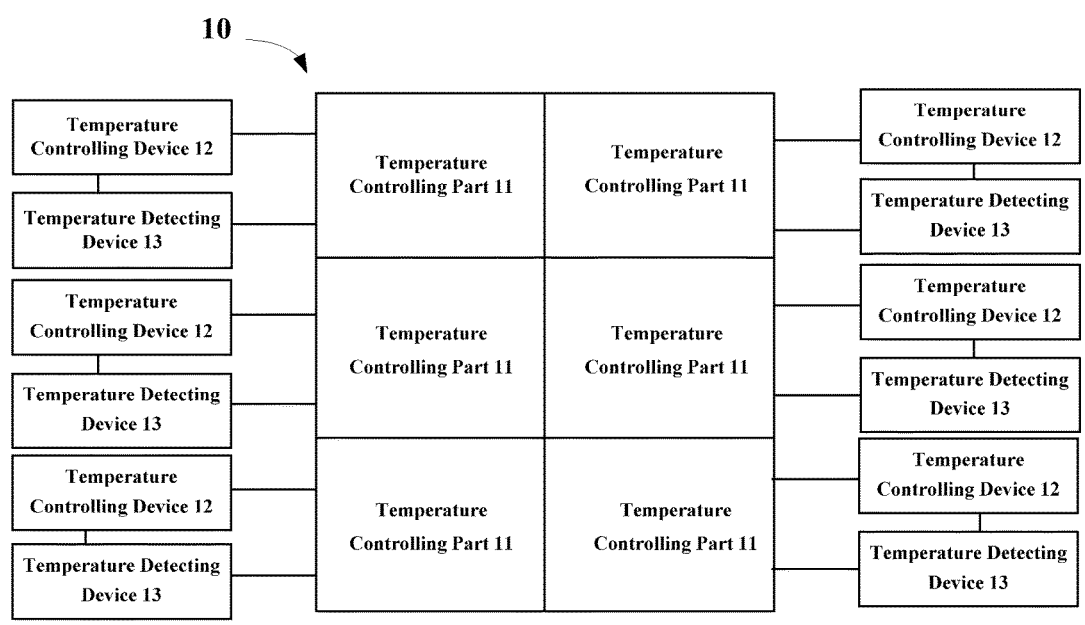
FIG. 1 is a schematic diagram showing a structure of a zone temperature controlling device according to an embodiment of the present disclosure.

In order to make the objects, the technical solutions and the advantages of the present disclosure more apparent, the present disclosure will be described hereinafter in a clear and complete manner in conjunction with the drawings and embodiments.

With respect to the technical problem of non-uniformity and unevenness for thickness of film coating formed by a conventional evaporation equipment, an evaporation equipment is provided by an embodiment of the present disclosure as below.

The evaporation equipment may include:

a support, which is arranged for loading a substrate to be evaporated, wherein a loading surface of the support includes a plurality of zones, and each of the plurality of zones corresponds to an evaporation region of the substrate to be evaporated; and a zone temperature controlling device, which includes at least two temperature controlling parts and at least one temperature controlling device, wherein each of the plurality of zones is arranged with a temperature controlling part, and the temperature controlling device is configured to control temperatures provided by the temperature controlling parts, so as to control corresponding deposition rates of film coating on the evaporation regions.

According to the evaporation equipment provided by the present disclosure, at an initial stage for evaporating a batch of substrates, thicknesses of film coating of the substrates are measured first. In the case that on the substrate there are evaporating regions where the resultant thickness of film coating does not meet the predetermined thickness, and when a next substrate to be evaporated is evaporated, the temperature provided by the temperature controlling parts is adjusted so as to control the deposition rate of film coating for the corresponding evaporation region of the next substrate. On the other hand, in the case that all the resultant thickness of film coating within respective evaporation regions on a substrate meets the predetermined thickness, the temperature provided by the temperature controlling parts corresponding to respective evaporation regions at that time are recorded, and when subsequent substrates are evaporated, the subsequent substrates are evaporated based on the recorded temperature, thereby the uniformity and evenness of thickness of film coating of the subsequent substrates to be evaporated can be guaranteed.

In the above embodiment, in the case that there is only one temperature controlling device, the temperature controlling device is connected with each of the temperature controlling parts; or in the case that there is a plurality of temperature controlling devices, each of the temperature controlling parts is connected with a corresponding temperature controlling device.

Alternatively, the zone temperature controlling device may further include at least one temperature detecting device, which is connected with the temperature controlling part and the temperature controlling device, and be configured to measure temperature provided by the temperature controlling part and provide the measured temperature to the temperature controlling device, such that the temperature controlling device controls the temperature provided by the temperature controlling part.

When being implemented, in the case that there is only one temperature detecting device, the temperature detecting device is connected with each of the temperature controlling parts; or in the case that there is a plurality of temperature detecting devices, each of the temperature controlling parts corresponds to one of the temperature detecting devices.

Alternatively, the evaporation equipment according to an embodiment of the present disclosure may further include: a film thickness measuring device, which is connected with the temperature controlling device(s), and is configured to measure a thickness of film coating within each of the evaporation regions of the substrate after the evaporation process and provide the measured thickness of film coating within each of the evaporation regions of the substrate to the temperature controlling device(s).

The film thickness measuring device may be an ellipsometer, or a magnetic coating thickness gauge, or an eddy current coating thickness gauge, an X ray fluorescence coating thickness gauge, or other devices that are capable of measuring thickness of film coating accurately.

The evaporation equipment may further include: an evaporating chamber. Here, the support and the zone temperature controlling device may be both arranged inside the evaporating chamber of the evaporation equipment. Alternatively, considering internal space of the chamber and in order to avoid adverse impact caused by evaporation vapor, the film thickness measuring device may be arranged outside the evaporating chamber. However, it can be appreciated that the film thickness measuring device may also be arranged inside the evaporating chamber, as long as certain conditions are met.

The temperature controlling device(s) may be connected with the film thickness measuring device and be further configured to determine whether or not the measured thickness of film coating within each of the evaporation regions of the substrate meets a predetermined thickness. For the region(s) where the measured thickness of film coating meets the predetermined thickness, the temperature provided by the corresponding temperature controlling parts may be maintained, while for the region(s) where the measured thickness of film coating do not meet the predetermined thickness, the temperature provided by the corresponding temperature controlling parts may be adjusted.

As it can be appreciated that, when evaporation vapor falls on zone(s) of the substrate having lower temperature by evaporation process, its heat energy is quickly absorbed by the zones of the substrate having lower temperature, such that the deposition rate for the corresponding zone(s) turns faster. As opposed to the above, when evaporation vapor falls on zone(s) of the substrate having higher temperature by evaporation process, the deposition rate for the corresponding zone(s) turns slower.

Based on the above principle, when the measured thickness of film coating within a certain evaporation region of the substrate is larger than the predetermined thickness, the temperature provided by the corresponding temperature controlling part may be raised up by the temperature controlling device, so as to decrease deposition rate of film coating for the corresponding evaporation region of a next substrate. When the measured thickness of film coating within a certain evaporation region of the substrate is smaller than the predetermined thickness, the temperature provided by the temperature controlling parts may be lowered by the temperature controlling device, so as to increase deposition rate of film coating for the corresponding evaporation region of a next substrate. And when the measured thickness of film coating within a certain evaporation region of the substrate is equal to the predetermined thickness, the temperature provided by the temperature controlling parts remains unchanged.

Please refer to FIG. 1, which is a schematic diagram showing a structure of a zone temperature controlling device according to an embodiment of the present disclosure. Specifically, the zone temperature controlling device includes six (6) temperature controlling parts 11, six (6) temperature controlling devices 12 and six (6) temperature detecting devices 13. Here, each temperature controlling part 11 is corresponding to a zone of the support, and the temperature controlling device 12 is configured to control temperature(s) provided by the temperature controlling part(s) 11, so as to control corresponding deposition rate(s) of film coating on the evaporation region(s) of the substrate to be evaporated that (those) correspond(s) to the zone(s). Each of the temperature detecting devices 13 is connected with the corresponding temperature controlling part 11 and the corresponding temperature controlling device 12, and is configured to measure temperature provided by the corresponding temperature controlling part 11 and provide the measured temperature to the corresponding temperature controlling device 12.

In this embodiment, the zone temperature controlling device 10 includes six (6) temperature controlling parts 11. However, the number of the temperature controlling parts 11 is not limited thereto. It can be appreciated that, the more temperature controlling parts 11 are (i.e., the more evaporation regions of the substrate are), the better uniformity and evenness of thickness of film coating can be controlled.

Figure 2:
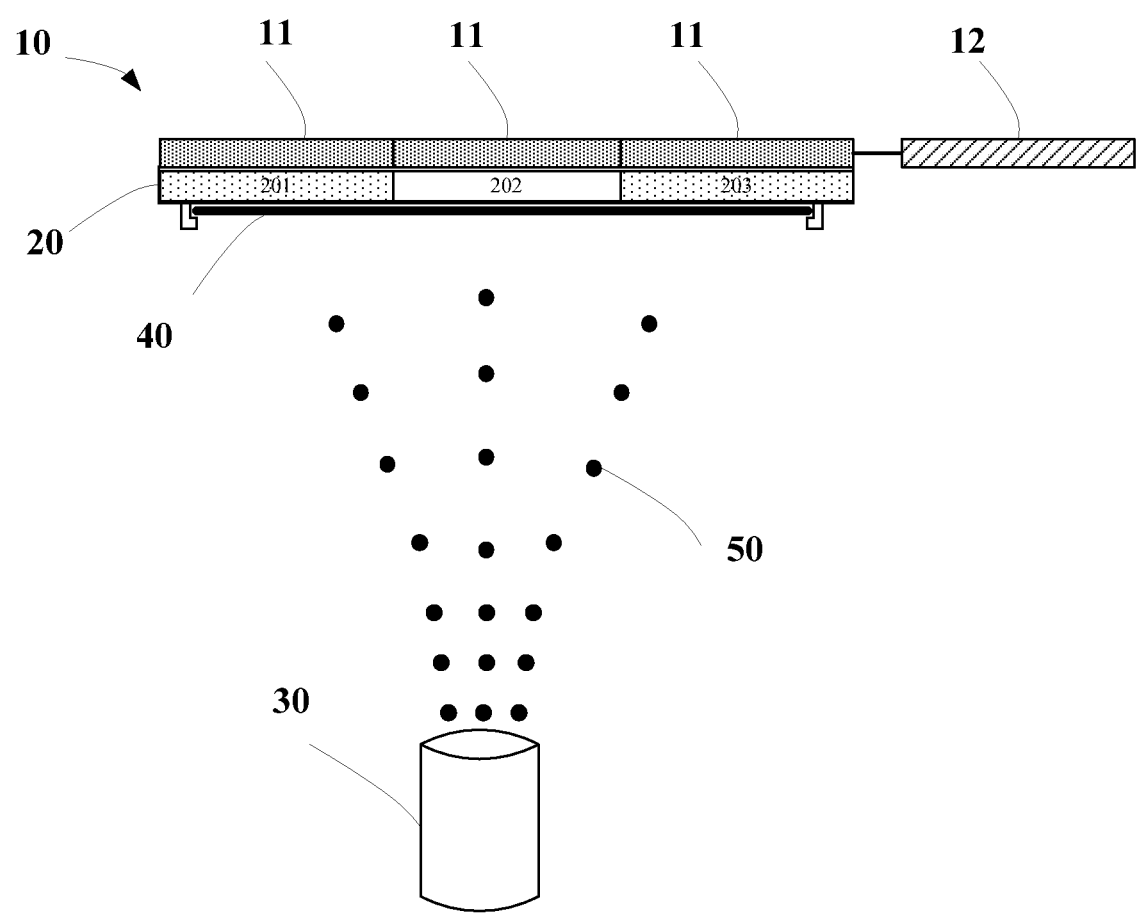
FIG. 2 is a schematic diagram showing a structure of an evaporation equipment according to an embodiment of the present disclosure.

Then please refer to FIG. 2, which is a schematic diagram showing a structure of an evaporation equipment according to an embodiment of the present disclosure. Specifically, the evaporation equipment includes:

a support 20, which is arranged for loading a substrate 40 to be evaporated, wherein a loading surface of the support 20 includes three (3) zones 201, 202, 203, each of the zones corresponds to an evaporation region of the substrate 40 to be evaporated, and the substrate 40 to be evaporated is arranged on a side of the support 20;

a zone temperature controlling device 10, which is arranged on another side of the support 20 and includes three (3) temperature controlling parts 11 and one temperature controlling device 12, wherein each of the zones is arranged with one temperature controlling part 11, and the temperature controlling device 12 is configured to control temperatures provided by the temperature controlling parts 11, so as to control corresponding deposition rates of film coating on the evaporation regions; and an evaporation source 30, which is configured to feed certain organic vapor 50.

The below please find descriptions about specific structure of zone temperature controlling device according to an embodiment of the present invention.

Figure 3:
FIG. 3 is a schematic diagram showing a structure of a zone temperature controlling device according to an embodiment of the present disclosure.

As shown in FIG. 3, each of the temperature controlling parts includes a liquid accommodation chamber, which is arranged between the support and the substrate to be evaporated, or on a side of the support opposite to the substrate to be evaporated, or inside the support.

And each of the temperature controlling devices includes:

a heating part, which is connected with the liquid accommodation chamber and is configured to heat liquid inside the liquid accommodation chamber;

a cooling part, which is connected with the liquid accommodation chamber and is configured to cool the liquid inside the liquid accommodation chamber; and at least one controlling part, which is connected with the heating part and the cooling part and is configured to control the heating part and/or the cooling part, so as to enable the liquid inside the liquid accommodation chamber to reach a predetermined temperature.

In this embodiment of the present disclosure, each of the liquid accommodation chambers is connected with a heating part, a cooling part and a controlling part. However, a controlling part may also be arranged to control several heating parts and several cooling parts. In other words, in the case that there is only one controlling part, the controlling part is configured to control each of the heating parts and each of the cooling parts that are connected with a plurality of liquid accommodation chambers; or in the case that there are a plurality of controlling parts, each of the heating parts and each of the cooling parts that are connected with the liquid accommodation chambers are controlled by one corresponding controlling part of the plurality of controlling parts.

When being implemented, a film thickness measuring device is configured to measure a thickness of film coating within each of the evaporation regions of the substrate after the evaporation process and provide the measured thickness of film coating within each of the evaporation regions of the substrate to the temperature controlling device(s).

The temperature detecting device is configured to measure temperature provided by the temperature controlling part and provide the measured temperature to the temperature controlling device, such that the temperature controlling device controls the temperature provided by the temperature controlling part.

Specifically, each of the temperature detecting devices may measure a temperature on a surface of a certain liquid accommodation chamber or measure a temperature of liquid inside the liquid accommodation chamber, as the temperature provided by the temperature controlling part obtained by measurement. Here, each of the temperature detecting devices may be a resistance thermometer, a thermistor thermometer and a thermocouple thermometer and so forth.

When the temperature provided by a certain temperature controlling part needs to be increased, a corresponding heating temperature for the corresponding heating part may be raised up by the corresponding controlling part, so as to raise up temperature of liquid flow inside the liquid accommodation chamber as well as the temperature provided by the temperature controlling part accordingly.

When the temperature provided by a certain temperature controlling part needs to be decreased, a corresponding heating temperature for the corresponding heating part may be lowered by the corresponding controlling part or the corresponding heating part may be turned off, as an alternative, the liquid flow inside the liquid accommodation chamber may be cooled under the control of the corresponding cooling part, so as to lower temperature of liquid flow inside the liquid accommodation chamber as well as the temperature provided by the temperature controlling part accordingly.

The above is only a specific embodiment of the zone temperature controlling device. In other embodiments of the present disclosure, alternative structures may be adopted for the zone temperature controlling device as well.

In the above embodiment, the temperature provided by the temperature controlling parts is within a range of 5-100° C., which can safeguard heating temperature of the temperature controlling parts being at relatively low temperature and impose no adverse impact on other film coatings having already formed on the substrate to be evaporated.

Figure 4:
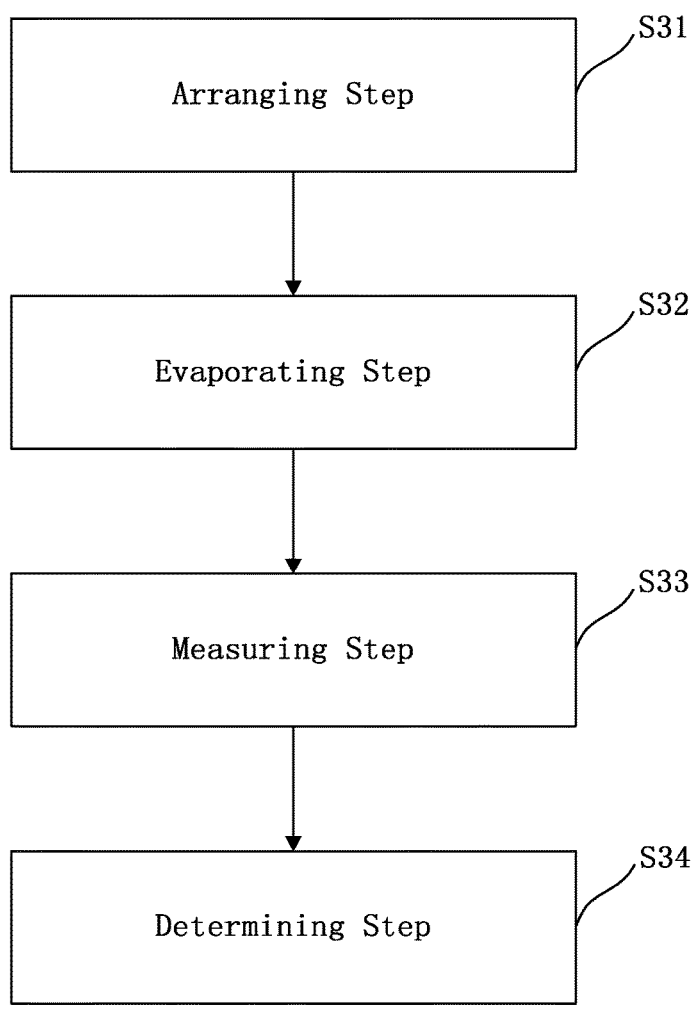
FIG. 4 is a flow chart showing an evaporating method according to an embodiment of the present disclosure.

Next please refer to FIG. 4, which is a flow chart showing an evaporating method according to an embodiment of the present disclosure. The method includes:

Step S31, an arranging step, in which a substrate to be evaporated is arranged on a support, wherein a loading surface of the support includes a plurality of zones, each of the plurality of zones corresponds to an evaporation region of the substrate to be evaporated, and the support is further arranged with a zone temperature controlling device that includes at least two temperature controlling parts, and wherein each of the plurality of zones is arranged with a temperature controlling part;

Step S32, an evaporating step, in which the substrate to be evaporated is evaporated;

Step S33, a measuring step, in which a thickness of film coating within each of the evaporation regions of the substrate is measured, after film coating is formed by the evaporation process, which is followed by having the substrate taken out of the evaporation chamber; and Step S34, a determining step, in which whether or not the measured thickness of film coating within each of the evaporation regions of the substrate meets a predetermined thickness is determined.

The temperature provided by the temperature controlling parts is maintained and a next substrate to be evaporated is evaporated at the current temperature provided by the temperature controlling parts, in the case that resultant thickness of film coating within each of the evaporation regions of the substrate meets the predetermined thickness.

On the other hand, the temperature provided by the temperature controlling parts is adjusted and a next substrate to be evaporated is evaporated at the adjusted temperature provided by the temperature controlling parts, in the case that on the substrate there is/are evaporating region(s) where the resultant thickness of film coating does not meet the predetermined thickness.

According to the above evaporating method provided by the present disclosure, at an initial stage for evaporating a batch of substrates, thicknesses of film coating of the substrates are measured first. And then temperatures provided by temperature controlling parts on different zones are adjusted according to the measured thicknesses, so as to control deposition rates of film coating on different evaporation regions of a next substrate to be evaporated, thereby the uniformity and evenness of thickness of film coating of subsequent substrates to be evaporated can be guaranteed.

In the above embodiment, when a first substrate is evaporated, the temperature controlling parts may be turned off, such that the temperature provided by the temperature controlling part is associated with ambient temperature inside the evaporation chamber. Thereafter when on the first substrate there is/are evaporating region(s) where the thickness of film coating fails to meet a predetermined thickness, the temperature controlling part corresponding to the evaporation region is turned on and the temperature provided by the temperature controlling part is adjusted accordingly. However, when a first substrate is evaporated, the temperature controlling part may also be turned on according to actual needs, such that the temperature controlling part can provide an initial temperature.

In the above embodiment, the film thickness measuring device that is used to measure thickness of film coating on the substrate may be arranged outside the evaporation chamber. Accordingly the substrate has to be taken out of the chamber, so as to measure thickness of film coating on respective evaporation regions of the substrate. However, the film thickness measuring device may well be arranged inside the evaporation chamber. When the film thickness measuring device is arranged inside the evaporation chamber, in Step S33, it is needless to take the substrate out of the evaporation chamber. Instead, the thickness of film coating on respective evaporation regions of the substrate may be measured without having the substrate removed from the evaporation chamber.

Alternatively, after the determining step, the method may further include: in the case that on the substrate there are evaporating regions where the resultant thickness of film coating does not meet the predetermined thickness, when a next substrate is to be evaporated, the measuring step and the determining step are repeated until the thickness of film coating within respective evaporation regions on the substrate to be evaporated subsequently meets the predetermined thickness.

Alternatively, after the determining step, the method may further include: in the case that the resultant thickness of film coating within respective evaporation regions on the substrate meets the predetermined thickness, when a next substrate is evaporated, the measuring step and the determining step are not conducted any longer. In other words, the temperature provided by respective temperature controlling parts remains unchanged when subsequent substrates are evaporated.

When being implemented, when the measured thickness of film coating within a certain evaporation region of the substrate is larger than the predetermined thickness, the temperature provided by the corresponding temperature controlling part may be raised up, so as to decrease deposition rate of film coating for the corresponding evaporation region of a next substrate. When the measured thickness of film coating within a certain evaporation region of the substrate is smaller than the predetermined thickness, the temperature provided by the temperature controlling parts may be lowered by the temperature controlling device, so as to increase deposition rate of film coating for the corresponding evaporation region of a next substrate. And when the measured thickness of film coating within a certain evaporation region of the substrate is equal to the predetermined thickness, the temperature provided by the temperature controlling parts remains unchanged.

For example, assuming that the thickness of film coating to be evaporated is d and the zone temperature controlling device includes six (6) temperature controlling parts. After film coating is formed by the evaporation process, the substrate is taken out of the evaporation chamber and the thicknesses of film coating within respective evaporation regions are measured. Supposed that the thicknesses of film coating within six evaporation regions on the substrate obtained by measurement are d1, d2, d3, d4, d5, d6, where d1>d2>d3>d4>d5>d6>d. Therefore, according to measurement result, temperatures provided by six temperature controlling parts are adjusted to be as follows: T1>T2>T3>T4>T5>T6>T (T is a temperature of the substrate without heating). Namely, the temperature provided by the temperature controlling part which corresponds to the evaporation region having a thicker film coating will be higher, so as to decrease the deposition rates of film coating within respective evaporation regions on a next substrate to be evaporated. As opposed to it, the temperature provided by the temperature controlling part which corresponds to the evaporation region having a thinner film coating will be lower, so as to increase the deposition rates of film coating within respective evaporation regions on a next substrate to be evaporated. In the end, a uniform and even thickness for film coating within respective evaporation regions can be guaranteed.

In addition, when all the resultant thicknesses of film coating within the six evaporation regions of the substrate are smaller than the predetermined thickness d, a period for evaporating a next substrate may be lengthened, so as to increase the thickness of film coating.

In the above embodiments, the substrate to be evaporated may be a substrate of an Organic Light-Emitting Diode (OLED) device. Accordingly, when uniformity and evenness of thickness for film coating within respective evaporation regions on the substrate are guaranteed, performance of the OLED device can be improved as well.

The above are merely alternative embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. An evaporating method, comprising:
    an arranging step, in which a substrate to be evaporated is arranged on a support, wherein a loading surface of the support includes a plurality of zones, each of the plurality of zones corresponds to an evaporation region of the substrate to be evaporated, and the support is further arranged with a zone temperature controlling device that includes at least two temperature controlling parts, and wherein each of the plurality of zones is arranged with a temperature controlling part;
    an evaporating step, in which the substrate to be evaporated is evaporated;
    a measuring step, in which a thickness of film coating within each of the evaporation regions of the substrate after the evaporation process is measured;
    a determining step, in which whether or not the measured thickness of film coating within each of the evaporation regions of the substrate meets a predetermined thickness is determined;

in the case that resultant thickness of film coating within each of the evaporation regions of the substrate meets the predetermined thickness, maintaining the temperature provided by the temperature controlling parts and evaporating a next substrate to be evaporated at the current temperature provided by the temperature controlling parts; and in the case that on the substrate there are evaporating regions where the resultant thickness of film coating does not meet the predetermined thickness, adjusting the temperature provided by the temperature controlling parts and evaporating a next substrate to be evaporated at the adjusted temperature provided by the temperature controlling parts.

2. The evaporating method according to claim 1, wherein when a first substrate is evaporated, the evaporating step comprises turning on the temperature controlling parts such that the temperature controlling parts provide an initial temperature.

3. The evaporating method according to claim 1, further comprising, after the determining step, a step of:

in the case that on the substrate there are evaporating regions where the resultant thickness of film coating does not meet the predetermined thickness, when a next substrate is evaporated, repeating the measuring step and the determining step.

4. The evaporating method according to claim 1, further comprising, after the determining step, a step of:

in the case that the resultant thickness of film coating within respective evaporation regions on the substrate meets the predetermined thickness, when a next substrate is evaporated, not conducting the measuring step and the determining step any longer.

5. The evaporating method according to claim 1, wherein in the case that on the substrate there are evaporating regions where the resultant thickness of film coating does not meet the predetermined thickness, the adjusting the temperature provided by the temperature controlling parts comprises:

when a resultant thickness of film coating within a evaporation region of the substrate is larger than the predetermined thickness, raising up the temperature provided by the corresponding temperature controlling part;

when a resultant thickness of film coating within a evaporation region of the substrate is smaller than the predetermined thickness, lowering the temperature provided by the corresponding temperature controlling part; and when a resultant thickness of film coating within a evaporation region of the substrate is equal to the predetermined thickness, unchanging the temperature provided by the corresponding temperature controlling part.

6. The evaporating method according to claim 1, further comprising, after the determining step, a step of:

when the resultant thicknesses of film coating within all of the evaporation regions of the substrate are smaller than the predetermined thickness, lengthening a period for evaporating a next substrate to be evaporated so as to increase the thickness of film coating.

7. The evaporating method according to claim 1, wherein the substrate to be evaporated is a substrate of an Organic Light-Emitting Diode (OLED) device.

8. The evaporating method according to claim 1, wherein the temperature provided by the temperature controlling parts is within a range of 5-100° C.

9. The evaporating method according to claim 2, wherein the temperature provided by the temperature controlling parts is within a range of 5-100° C.

\* \* \* \* \*